(12) United States Patent
Takenaka et al.

(10) Patent No.: US 6,191,667 B1
(45) Date of Patent: Feb. 20, 2001

(54) LAMINATION TYPE INDUCTOR ARRAY

(75) Inventors: Kazuhiko Takenaka, Yokaichi; Tatsuru Takaoka, Omihachiman, both of (JP)

(73) Assignee: Murata Mfg. Co., Ltd. (JP)

( * ) Notice: Under 35 U.S.C. 154(b), the term of this patent shall be extended for 0 days.

(21) Appl. No.: 09/347,626

(22) Filed: Jul. 2, 1999

(30) Foreign Application Priority Data

Jul. 2, 1998 (JP) .................................................. 10-187504

(51) Int. Cl.$^7$ .............................. H03H 7/00; H01F 27/28
(52) U.S. Cl. ............................................ 333/185; 336/232
(58) Field of Search ............................. 333/185; 336/200, 336/232, 234

(56) References Cited

U.S. PATENT DOCUMENTS 4,918,417 * 4/1990 Sakamoto ................................ 336/83

5,034,709 * 7/1991 Azumi et al. .......................... 333/184

* cited by examiner

*Primary Examiner*—Robert Pascal
*Assistant Examiner*—Kimberly E Glenn
(74) *Attorney, Agent, or Firm*—Keating & Bennett, LLP

(57) ABSTRACT

A laminated body includes a first insulating sheet having first internal conductors disposed thereon, a second insulating sheet having second internal conductors are given, and a protective sheet, wherein the internal conductors define inductors. The first insulating sheet, the second insulating sheet and the protective sheet are stacked on top of each other and laminated to define the laminated body. When a distance between the end surfaces in a length direction of the laminated body and the inductors located adjacent the end surfaces is less than a fixed value, the internal conductors defining the inductors on the side of the end surfaces are arranged in a zig zag pattern which extends toward inner inductors.

20 Claims, 7 Drawing Sheets

LAMINATION TYPE INDUCTOR ARRAY

BACKGROUND OF THE INVENTION

1. Field of the Invention

The present invention relates to a lamination type inductor array and more particularly, to a lamination type inductor array to be used as a noise filter or other electronic component in high-frequency electronic circuits and other electronic circuits.

2. Description of the Related Art

One example of such a conventional lamination type inductor array is shown in FIGS. 10 and 11. This lamination type inductor array 15 includes a first insulating sheet 1 having internal conductors 5a–8a disposed on a surface thereof, a second insulating sheet 2 having second internal conductors 5b–8b disposed on a surface thereof, and a protective sheet 3. The linear internal conductors 5a–8a and 5b–8b are arranged so as to extend from and to opposite edges of the sheets 1, 2, respectively.

The sheets 1–3 are stacked on one another, and are integrally baked to define a laminated body 10 as shown in FIG. 11. On the opposite side surfaces of the laminated body 10, external input electrodes 11a–14a and external output electrodes 11b–14b are provided, respectively. The internal conductors 5a and 5b are connected in parallel between the external electrodes 11a and 11b, and define a linear inductor 5. The internal conductors 6a and 6b are connected in parallel between the external electrodes 12a and 12b, and define a linear inductor 6. The internal conductors 7a and 7b are connected in parallel between the external electrodes 13a and 13b, and define a linear inductor 7. The internal conductors 8a and 8b are connected in parallel between the external electrodes 14a and 14b, and define a linear inductor 8.

In the conventional lamination type inductor array 15, the internal conductors 5a, 5b, 6a, 6b, 7a, 7b, 8a, and 8b have the same shape, respectively, and the shape of the inductors 5–8 is the same. When the external dimensions of the laminated body 10 are made smaller so that the inductor array 15 becomes small-sized, the distance d1 (see FIGS. 10 and 11) between the end surfaces in the length direction of the laminated body 10 and the inductors 5 and 8 located adjacent the end surface becomes smaller than the distance d2 between the inductors 5–8.

Because of this fact, the cross section of the magnetic paths which are defined between the inductors 5, 8 on the side of the end surfaces of the laminated body 10 and the end surfaces and along which the magnetic lines of force φ of the inductors 5 and 8 pass, becomes smaller. Therefore, the magnetic reluctance of the magnetic paths of the inductors 5 and 8 is increased, and the inductance of the inductors 5 and 8 becomes smaller than that of the inductors 6 and 7.

For example, the actual values at the time when the laminated body 10 has a relative magnetic permeability of 20 is shown in FIG. 13. When the distance d1 is less than 0.5 mm, the inductance of the inductors 5 and 8 on the side of the end surfaces begins to be reduced. When the distance d1 is 0.2 mm, the inductance of the inductors 5 and 8 is about five percent smaller than that of the inner inductors 6 and 7. When the distance d1 is 0.1 mm, the inductance of the inductors 5, 8 is about 13 percent smaller than that of the inductors 6, 7. Even if the sheets 1–3 have a relative magnetic permeability other than 20, the result described above still occurs.

Accordingly, there is a problem with the conventional lamination type inductor array 15 in that the inductance of the inductors 5 and 8 on the side of the end surfaces varies from that of the inner inductors 6 and 7. As a result, dispersion of the electrical characteristics such as noise elimination capability of the inductors 5–8 occurs because of the characteristics which are dependent on the location of the inductors inside the laminated body 10.

SUMMARY OF THE INVENTION

To overcome the problems described above, preferred embodiments of the present invention provide a lamination type inductor array in which each of the inductors has a substantially equal inductance regardless of the location inside of the laminated body.

According to one preferred embodiment of the present invention, a lamination type inductor array includes a laminated body having insulating material layers and substantially linear internal conductors stacked on each other, a plurality of pairs of external input and output electrodes provided on a surface of the laminated body, and a plurality of inductors arranged in such a manner that both ends of each of the internal conductors are connected to the external input and output electrodes, wherein the shape of the internal conductors of the inductors located adjacent to the end surfaces of the laminated body is different from the shape of the internal conductors of the inductors disposed inside the inductors located adjacent to the end surfaces of the laminated body so that the inductance of each of the inductors is substantially equal. Based on the above construction, each of the inductors has internal conductors having a shape which is dependent on the location of the internal conductors, and the inductance of each of the inductors is substantially equal.

By making the conductor length of the internal conductors of the inductors located adjacent to the end surfaces of the laminated body longer than the conductor length of internal conductors of the inductors disposed inside of the inductors located adjacent to the end surfaces of the laminated body, the number of magnetic lines of force generated by the inductors adjacent to the end surfaces of the laminated body is increased. Because of the increased number of magnetic lines of force, any reduction in inductance caused by the decreased cross section of the magnetic path of the inductors located adjacent to the end surfaces of the laminated body is compensated so as to be negated.

Further, by arranging the internal conductors which are located adjacent to the end surfaces of the laminated body to extend in a meandering line toward the side of the inductors located inside of the inductors adjacent to the end surfaces of the laminated body, the cross section of the magnetic path of the inductors adjacent to the end surface of the laminated body is greatly increased. Because of the increased cross section, the magnetic reluctance of the magnetic path of the inductors adjacent to the end surfaces of the laminated body is suppressed.

Further, by making the conductor width of the internal conductors of the inductors disposed inside of the inductors adjacent to the end surfaces of the laminated body wider than the conductor width of the internal conductors of the inductors adjacent to the end surfaces, the cross section of the magnetic paths in which the magnetic lines of force of the inductors disposed inside of the inductors adjacent to the end surfaces of the laminated body pass is significantly reduced. Therefore, the magnetic reluctance of the magnetic paths of the inductors disposed inside is increased. Because of this increased magnetic reluctance, the inductance of the inductors located adjacent to the end surfaces of the laminated body is substantially equal to the inductance of the inductors located inside of the inductors.

Furthermore, a lamination type inductor array according to preferred embodiments of the present invention has a laminated body which is substantially rectangular parallelepiped and has inductors arranged along a longitudinal direction of the laminated body. A distance between the end surfaces in the longitudinal direction of the laminated body and the internal conductors of the inductors located adjacent to the end surfaces is preferably less than about 0.5 mm. With the above construction, it is possible to significantly reduce the size of the inductor array and to make the inductance of each of the inductors nearly equal.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1:
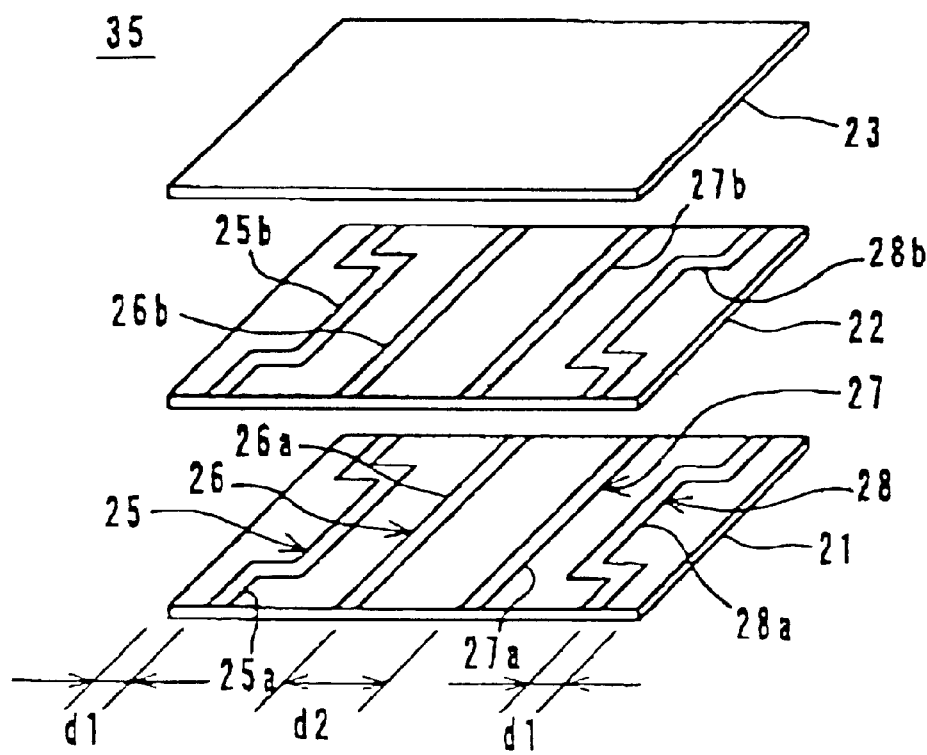
FIG. 1 is an exploded perspective view showing a first preferred embodiment of a lamination type inductor array according to the present invention.

Hereinafter, preferred embodiments of a lamination type inductor array according to the present invention are explained with reference to the accompanying drawings. In each of the preferred embodiments, similar components and elements are indicated by the same reference numerals to avoid repetitive description.

As shown in FIG. 1, a lamination type inductor array 35 preferably includes a first insulating sheet 21 having first internal conductors 25a–28a disposed on a surface thereof, a second insulating sheet 22 having second internal conductors 25b–28b disposed on a surface thereof, and a protective sheet 23. The material used to form the substantially rectangular sheets 21–23 preferably is a magnetic material such as ferrite or other suitable magnetic material, dielectric material such as ceramic or other suitable dielectric material, and insulating material are preferably used.

In a first preferred embodiment, a material having a relative magnetic permeability of 20 is preferably used. However, other suitable materials may be used.

The internal conductors 25a–28a and 25b–28b are formed on the surface of the insulating sheets 21 and 22 preferably by a method of printing, sputtering, vapor deposition, or other suitable method. The internal conductors 25a–28a and 25b–28b are preferably made of at least one of: Ag, Ag-Pd, Ag-alloy, Cu, Cu-alloy, Ni, Ni-alloy, and other suitable materials.

The internal conductors 25a–28a and 25b–28b are arranged to extend to and from opposite edges of the back side of the sheets 21 and 22, respectively, and are arranged to extend along the longitudinal direction of the sheets 21 and 22. The internal conductors 25a, 25b, 28a, and 28b located adjacent to the right and left edges of the sheets 21, and 22 are nearly linear conductors arranged in a zig-zag line extending toward the side of the internal conductors 26a, 26b, 27a, and 27b disposed inside of internal conductors 25a, 25b, 28a, and 28b respectively. The internal conductors 26a, 26b, 27a, and 27b preferably have a linear shape.

Figure 2:
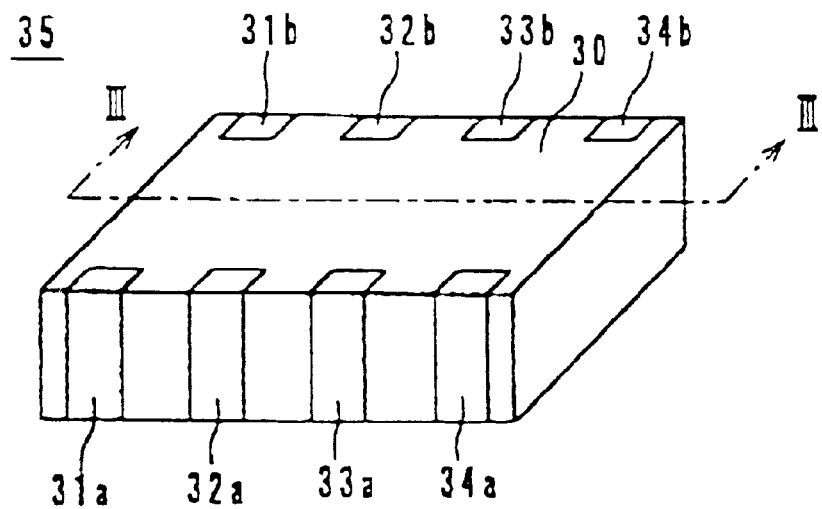
FIG. 2 is a perspective view of the external appearance of the lamination type inductor array shown in FIG. 1.

The sheets 21–23 are stacked on one another, and are baked integrally to define a laminated body 30, preferably having a substantially rectangular parallelepiped shape as shown in FIG. 2. On the opposite side surfaces of the laminated body 30, external input electrodes 31a–34a and external output electrodes 31b through 34b are provided, respectively. These external electrodes 31a–34b are preferably formed via a method of applying and baking conductive paste of Ag, Ag-Pd, Ag-alloy, Cu, Cu-alloy, and other materials or via dry plating.

The internal conductors 25a and 25b, both end portions of each of which are electrically connected to the external electrodes 31a and 31b, are connected in parallel between the external electrodes 31a and 31b and define a substantially linear inductor 25. In the same way, the internal conductors 26a and 26b are electrically connected in parallel between the external electrodes 32a and 32b, and define a linear inductor 26. The internal conductors 27a and 27b are electrically connected in parallel between the external electrodes 33a and 33b, and define a linear inductor 27. The internal conductors 28a and 28b are electrically connected in parallel between the external electrodes 34a and 34b, and define a linear inductor 28. That is, the inductors 25–28 are arranged such that the internal conductors 25a–28b have their input terminal and output terminal disposed on the same sheet, respectively.

Figure 3:
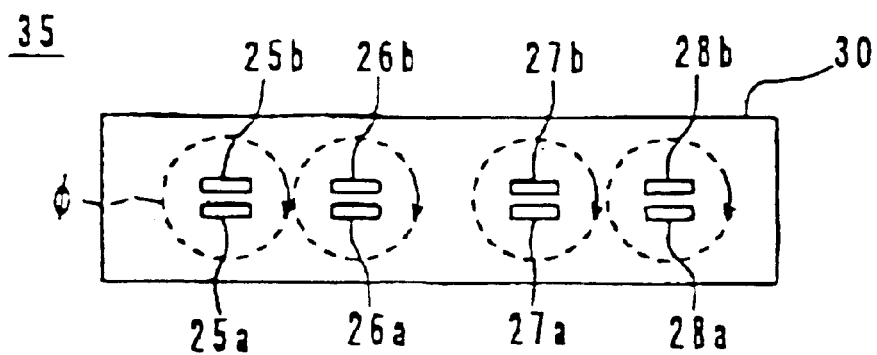
FIG. 3 is a longitudinal section view taken on line III—III of FIG. 2 to explain the magnetic path.

In the lamination type inductor array 35 constructed as described above, the inductors 25–28 are arranged along the length direction of the laminated body 30. In order to reduce the size of the inductor array 35, even if the distance d1 between each of both end surfaces of the laminated body 30 and the inductors 25 and 28 located adjacent the end surfaces is about 0.5 mm or less, the internal conductors 25a, 25b, 28a, and 28b of the inductors 25 and 28 are arranged to extend in a meandering line toward the side of the inductors 26 and 27. As a result, the cross section of the magnetic paths formed between the inductors 25 and 28 and the end surfaces of the laminated body 30 is greatly increased (see FIG. 3). Because of this increased cross section of the magnetic paths, the increase of magnetic reluctance of the magnetic paths of the inductors 25 and 28 is suppressed. As a result, the cross section of the magnetic paths through which the magnetic lines of force φ of each of the inductors 25–28 pass is made substantially equal, and the magnetic reluctance (magnetic field intensity) is made substantially equal. In this way, a lamination type inductor array 35 in which the inductance of each of the inductors 25–28 is substantially equal with very little deviation therebetween is provided.

Further, this inductor array 35 is preferably mass-produced in the form of a mother board having a plurality of inductor arrays mounted thereon. In this case, even if the cutting position is slightly displaced when the inductor arrays 35 of the mother board are cut into each of the individual components, because the cross section of the magnetic paths formed between the inductors 25 and 28 and the end surfaces of the laminated body 30 is large, the rate of change of the inductance of the inductors 25 and 28 is very small. As a result, the variations of inductance caused by the displacements of the cutting position is significantly reduced.

Figure 4:
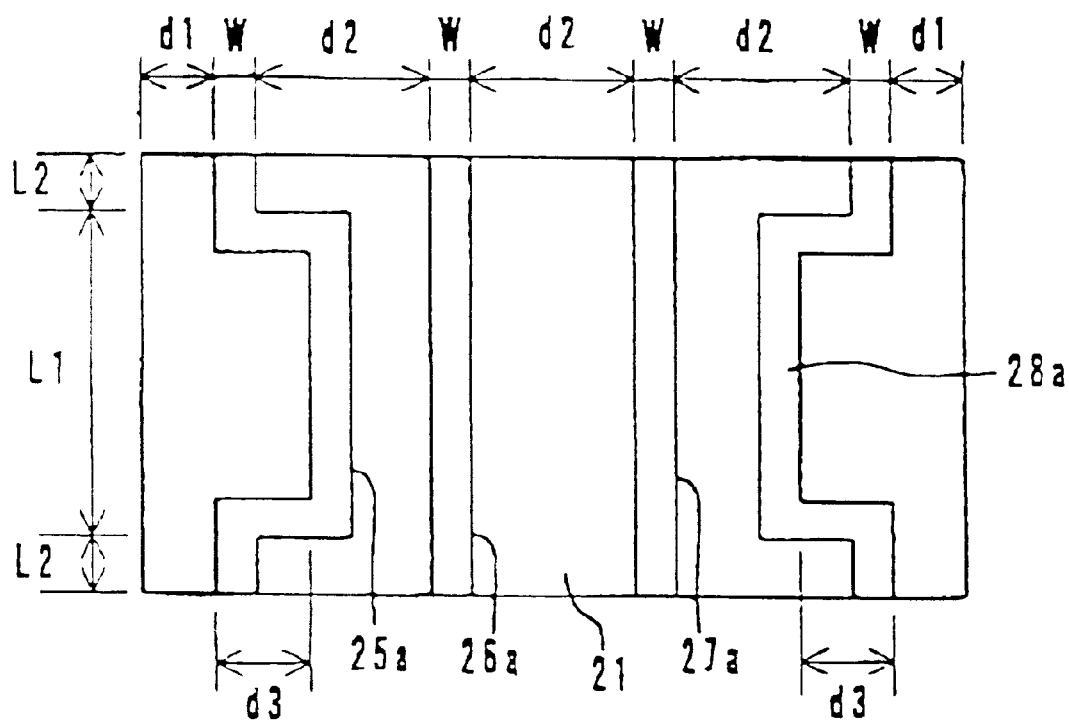
FIG. 4 is a plan view showing the internal conductors of the lamination type inductor array shown in FIG. 1.

Further explanation is provide with respect to examples. As shown in the example of FIG. 4, the conductor width W of each of the internal conductors 25a–28b is about 0.15 mm. The distance d1 between the right and left edges of the sheets 21 and 22 and the internal conductors 25a, 25b, 28a, and 28b located adjacent to the edges is about 0.15 mm. The distance d2 between the internal conductors 25a–28a and between the internal conductors 25b–28b next to each other on the same sheet is about 0.7 mm.

Figure 5:
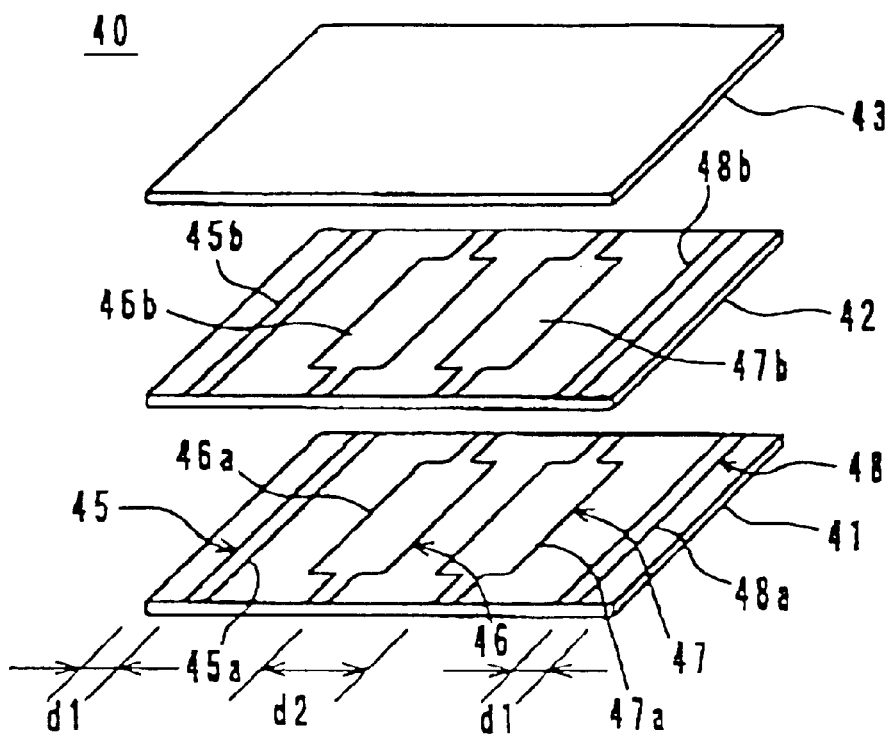
FIG. 5 is an exploded perspective view showing a second preferred embodiment of a lamination type inductor array according to the present invention.
Figure 13:
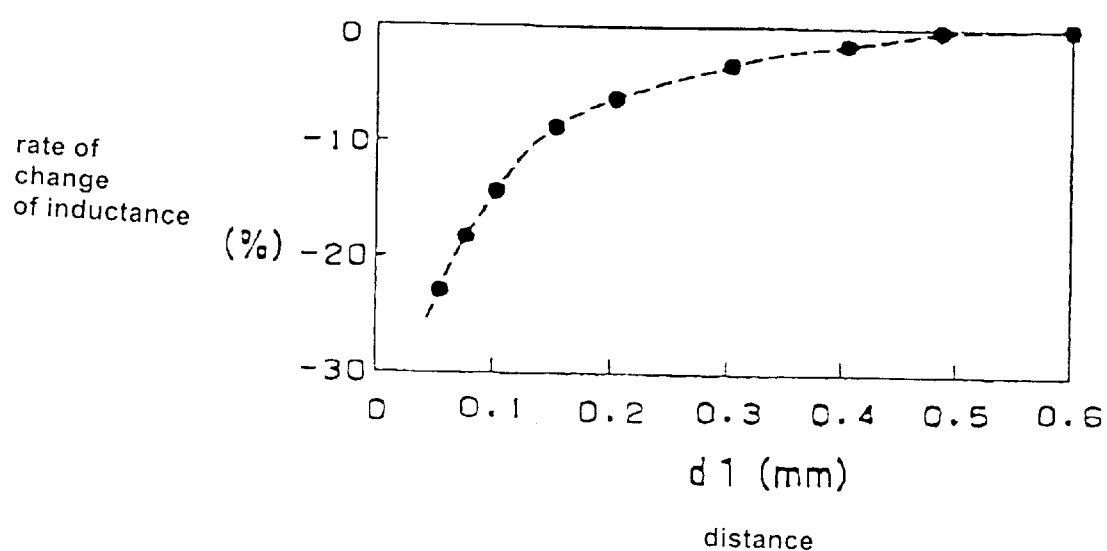
FIG. 13 is a graph showing a measurement concerning the relation of the distance d1 between the end surfaces of a laminated body and the inductors located adjacent the end surfaces to the rate of change of the inductance of the inductors.

Now, for example, if the above distance d1 is about 0.15 mm and the internal conductors 25a–28b have substantially the same linear shape and are spaced at substantially equal distances from each other as in the conventional lamination type inductor array, as clearly seen from FIG. 13, the inductance of the inductors 25 and 28 on the side of the end surfaces of the laminated body 30 is about 9.1% smaller than that of the inner inductors 26 and 27. Then, in the first preferred embodiment, at d1=0.15 mm, the internal conductors 25a, 25b, 28a, and 28b on the side of the end surfaces are arranged in a meandering line of d3=0.43 mm toward the side of the inductors 26 and 27. In FIG. 4, L1 and L2 are preferably arranged such that L1=1.2 mm, L2=0.2 mm As shown in FIG. 5, a lamination type inductor array 40 preferably includes a first insulating sheet 41 having first internal conductors 45a–48a disposed on a surface thereof, a second insulating sheet 42 having second internal conductors 45b–48b disposed on a surface thereof, and a protective sheet 43. The internal conductors 45a, 45b, 48a, and 48b located adjacent to the right and left edges of the sheets 41 and 42 preferably have a linear shape. The internal conductors 46a, 46b, 47a, and 47b which are located inside of the internal conductors 45a, 45b, 48a, and 48b are approximately linear conductors. The conductor widths of the internal conductors 46a, 46b, 47a, and 47b are greater than that of the internal conductors 45a, 45b, 48a, and 48b.

The sheets 41–43 are stacked on one another, and, in the same way as the inductor array 35 of the first preferred embodiment, are baked integrally to define a laminated body preferably having a substantially rectangular parallelepiped shape. Then, on the surface of the laminated body, external input electrodes and external output electrodes are formed. The internal conductors 45a, 45b, 46a, 46b, 47a, 47b, 48a, and 48b are electrically connected in parallel between the external electrodes respectively, and define nearly linear inductors 45, 46, 47, and 48.

In the lamination type inductor array 40 constructed as described above, because the conductor widths of the internal conductors 46a, 46b, 47a, and 47b of the inductors 46 and 47 are increased, the cross sections of the magnetic paths through which the magnetic lines of force φ of the inductors 46 and 47 are reduced and the magnetic reluctance is increased.

In this case, the magnetic reluctance of the magnetic paths of the inductors 45 and 48 is also increased because the distance d1 between each of both end surfaces of the laminated body and the inductors 45 and 48 located adjacent to the end surfaces on the side of the end surfaces is about 0.5 mm or less. In order to greatly reduce the size of the lamination type inductor array 40, the increased magnetic reluctance of the inductors 46 and 47 is made substantially equal to the magnetic reluctance of the magnetic paths of the inductors 45 and 48.

Therefore, a lamination type inductor array 40 in which the inductance of each of the inductors 45–48 is nearly equal and has very little deviation, is provided.

Figure 6:
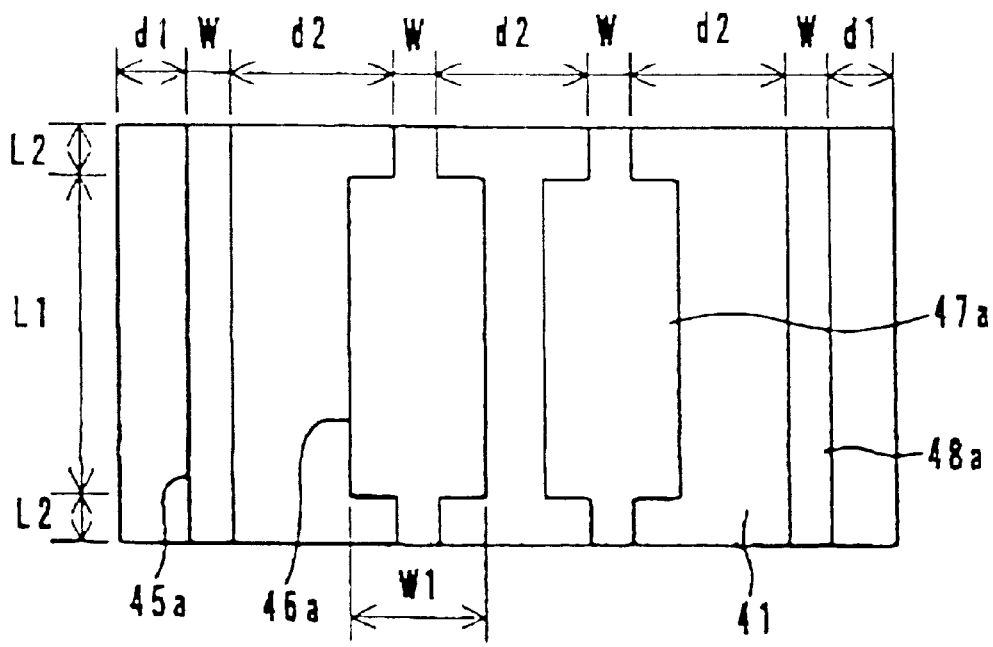
FIG. 6 is a plan view showing the internal conductors of the lamination type inductor array shown in FIG. 5.
Figure 7:
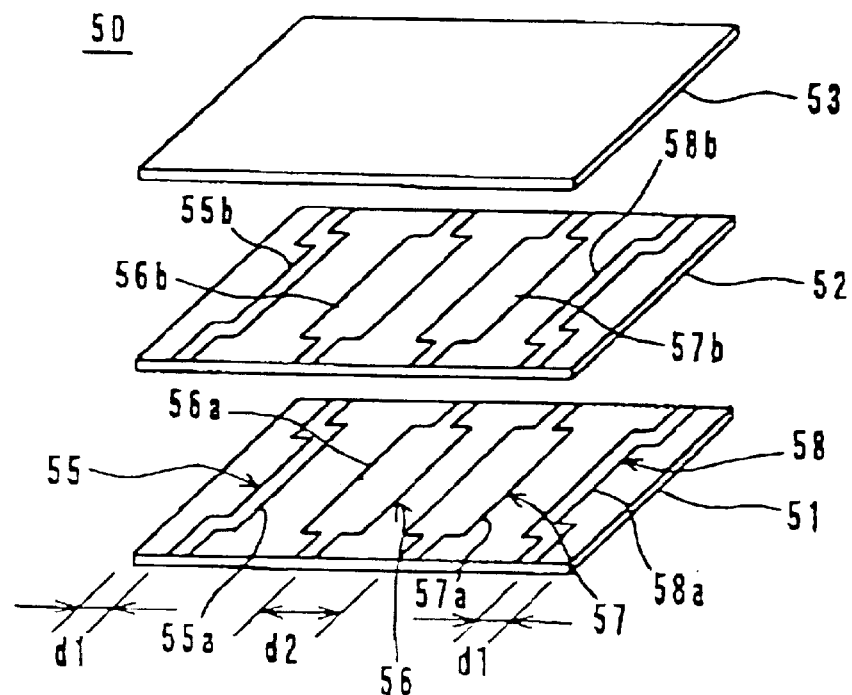
FIG. 7 is an exploded perspective view showing a third preferred embodiment of a lamination type inductor array according to the present invention.

Furthermore, the inductor array of this preferred embodiment is explained in detail using specific examples. As shown in FIG. 6, the conductor width W of the internal conductors 45a, 45b, 48a, and 48b is about 0.15 mm. The distance d1 between the right and left edges of the sheets 41 and 42 and the conductors 45a, 45b, 48a, and 48b located adjacent to the edges is about 0.15 mm. The distances d2 between the internal conductors 45a–48a and between the internal conductors 45b–48b located adjacent to each other are about 0.7 mm. In this case, the conductor width W1 of the internal conductors 46a, 46b, 47a, and 47b of the inner conductors 46 and 47 is about 0.25 mm. In this example, in FIG. 6, L1 and L2 are preferably arranged such that L1=1.2 mm, L2=0.2 mm As shown in FIG. 7, a lamination type inductor array 50 includes a first insulating sheet 51 having first internal conductors 55a–58a provided thereon, a second insulating sheet 52 having second internal conductors 55b–58b provided thereon, and a protective sheet 53. The internal conductors 55a, 55b, 58a, and 58b located adjacent to the right and left edges of the sheets 51 and 52 are preferably nearly linear conductors arranged to extend in a zig-zag line toward the side of the internal conductors 56a, 56b, 57a, and 57b located inside. The internal conductors 56a, 56b, 57a, and 57b which are nearly linear have greater conductor widths than the internal conductors 55a, 55b, 58a, and 58b.

The sheets 51–53 are stacked on one another, and in the same way as the inductor array 35 of the first preferred embodiment, are baked integrally to define a laminated body having a substantially rectangular parallelepiped shape. Then, on the surface of the laminated body, external input and output electrodes are provided. The internal conductors 55a, 55b, 56a, 56b, 57a, 57b, 58a, and 58b are electrically connected in parallel between the external electrodes, respectively, and constitute nearly linear inductors 55, 56, 57, and 58.

In the lamination type inductor array 50 constructed as described above, because the internal conductors 55a, 55b, 58a, and 58b of the inductors 55 and 58 are arranged to extend along a zig-zag line toward the side of the inductors 56 and 57, the cross sections of the magnetic paths formed between the inductors 55 and 58 and the end surfaces of the laminated body are greatly increased so as to suppress the increase of the magnetic reluctance of the magnetic paths. Because the conductor width of the internal conductors 56a, 56b, 57a, and 57b of the inductors is increased, the cross sections of the magnetic path through which the magnetic lines of force φ of the inductors 56 and 57 is reduced and the magnetic reluctance is increased. Thus, by increasing the magnetic reluctance of the magnetic paths of the inductors 55 and 58 because of the distance d1 between each of both end surfaces of the laminated body and the inductors 55 and 58 located adjacent to both end surfaces is about 0.5 mm or less which also decreases the size of the inductor, the magnetic reluctance of the magnetic paths of the inductors 55 and 58 are substantially equal to the increased magnetic reluctance of the magnetic paths of the inductors 56 and 57. As a result, a lamination type inductor array 50 in which the inductance of each of the inductors 55–58 is nearly equal and has very little deviation therebetween is provided. In addition, in this inductor array 50, as in the inductor array 35 of the first preferred embodiment, the variations of inductance due to the displacement of cutting positions is greatly reduced.

Figure 8:
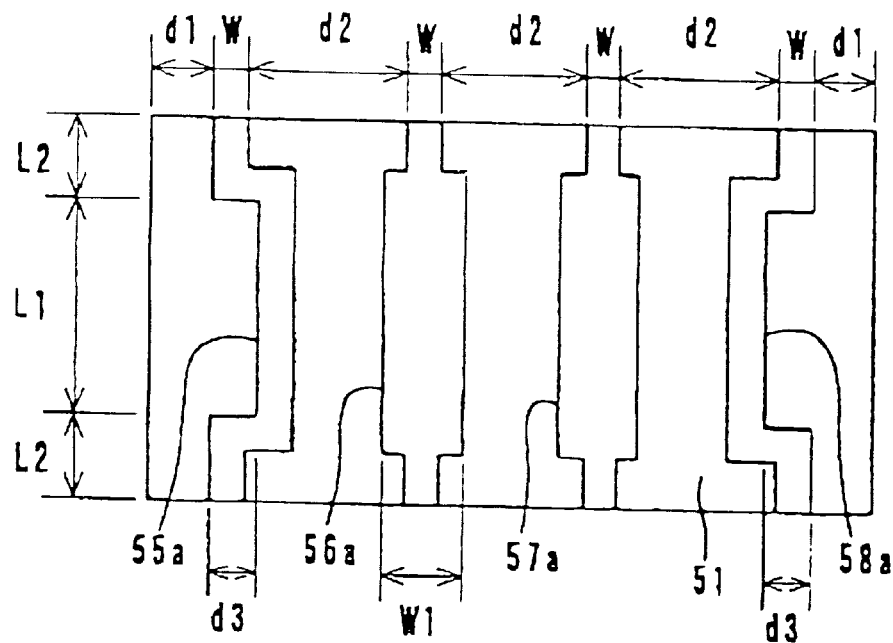
FIG. 8 is a plan view showing the internal conductors of the lamination type inductor array shown in FIG. 7.
Figure 9:
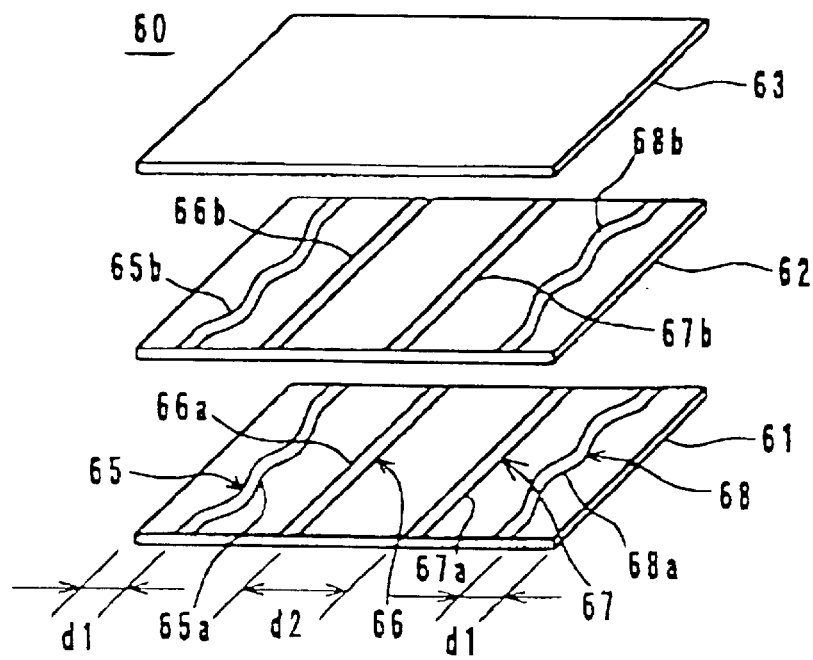
FIG. 9 is an exploded perspective view showing a fourth preferred embodiment of a lamination type inductor array according to the present invention.
Figure 10:
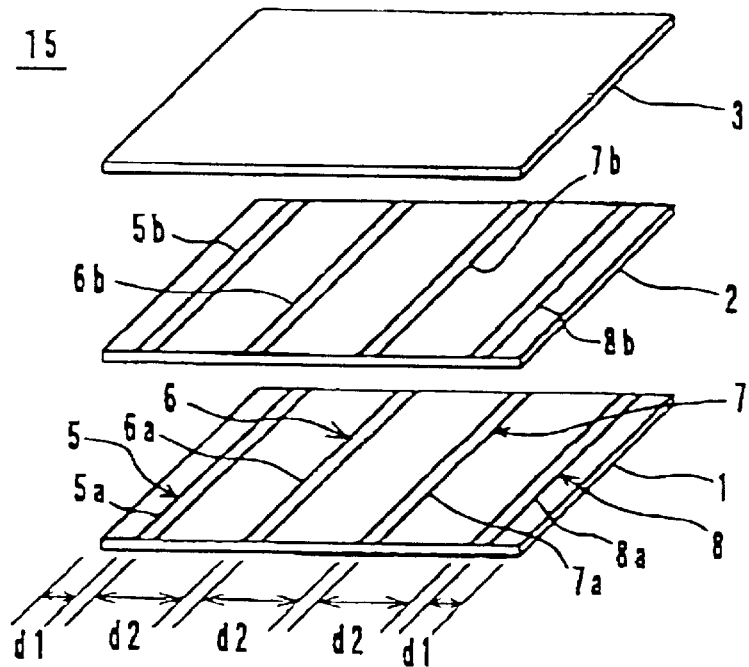
FIG. 10 is an exploded perspective view of a conventional lamination type inductor array.
Figure 11:
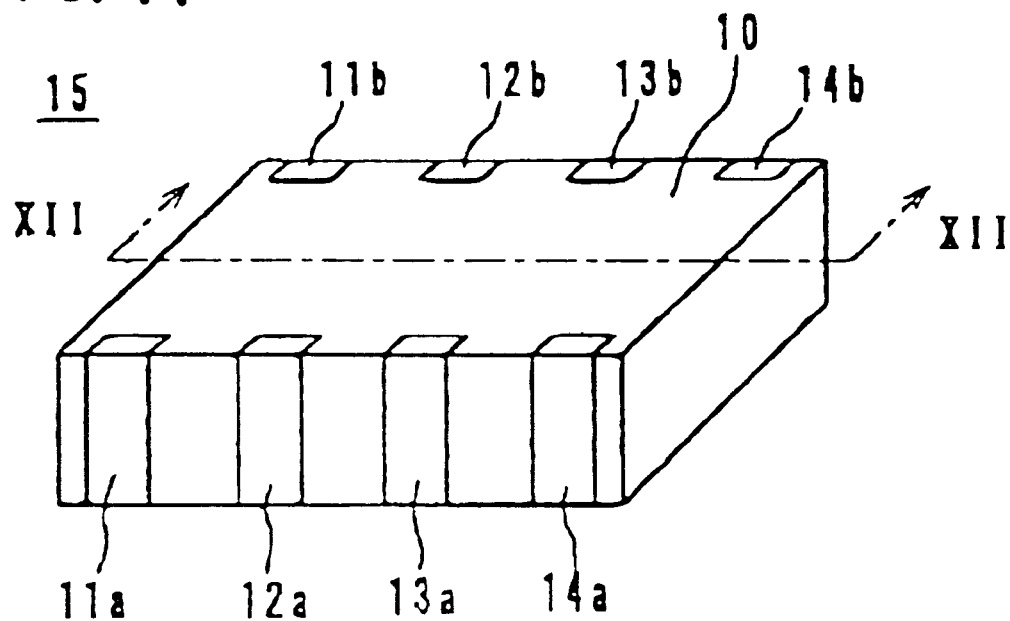
FIG. 11 is a perspective view of the external appearance of the lamination type inductor array shown in FIG. 10.
Figure 12:
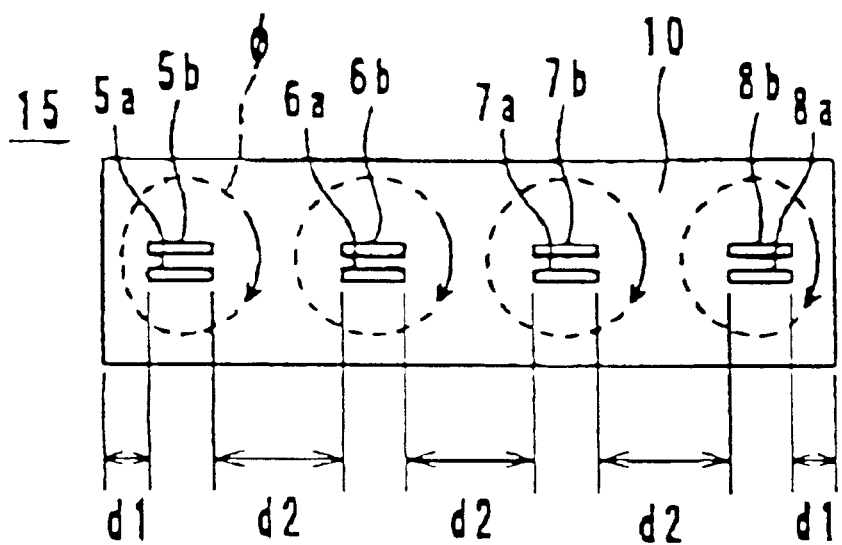
FIG. 12 a longitudinal section view taken on line XII—XII of FIG. 11 to explain the magnetic path.

Further explanation is provided with respect to examples. As shown in FIG. 8, the conductor width W of the internal conductors 55a, 55b, 58a, and 58b is about 0.15 mm. The distance d1 between the right and left edges of the sheets 21 and 22 and the internal conductors 55a, 55b, 58a, and 58b located adjacent to the edges is about 0.15 mm. The distances d2 between the internal conductors 55a–58a next to each other and between the internal conductors 55–58b next to each other are about 0.7 mm. In this case, the internal conductors 55a, 55b, 58a, and 58b of the inductors 55 and 58 on the side of the end surfaces are arranged to extend in a zig-zag line of d3=0.2 mm toward the side of the inductors 56 and 57, and the conductor width W1 of the internal conductors 56a, 56b, 57a, and 57b of the inductors 56 and 57 is about 0.2 mm. In FIG. 8, L1 and L2 are constructed such that L1=1.2 mm, L2=0.2 mm As shown in FIG. 9, a lamination type inductor array 60 preferably includes a first insulating sheet 61 having first internal conductors 65a–68a provided on a surface thereof, a second insulating sheet 62 having second internal conductors 65b–68b provided on a surface thereof, and a protective sheet 63. The internal conductors 65a, 65b, 68a, and 68b located adjacent to the right and left edges of the sheets 61 and 62 are preferably nearly linear conductors arranged to extend in a zig-zag line toward the side of the internal conductors 66a, 66b, 67a, and 67b, respectively.

The sheets 61–63 are stacked on one another, and, in the same way as in the inductor array 35 of the first preferred embodiment, are baked integrally to define a laminated body preferably having a substantially rectangular parallelepiped shape. Then, on the surface of the laminated body, external input and output electrodes are formed. The internal conductors 65a, 65b, 66a, 66b, 67a, 67b, 68a, and 68b are electrically connected in parallel between the external electrodes, respectively, and define nearly linear inductors 65, 66, 67, and 68.

In the lamination type inductor array 60 constructed as described above, because the internal conductors 65a, 65b, 68a, and 68b of the inductors 65 and 68 are arranged to extend in a zig-zag line toward the side of the internal conductors 66a, 66b, 67a, and 67b, respectively, the conductor length of the internal conductors 65a, 65b, 68a, and 68b of the inductors 65 and 68 is longer than that of the internal conductors 66a, 66b, 67a, and 67b of the inductors 66 and 67. Therefore, the number of magnetic lines of force φ generated by the inductors 65 and 68 is increased, and in order to reduce the size of the inductor array 60, the decrease in the inductance of the inductors 65 and 68, which is caused by setting the distance d1 between each of both end surfaces of the laminated body and the inductors 65 and 68 located adjacent to the end surfaces to about 0.5 mm or less, can be eliminated through compensation. As a result, it is able to obtain a lamination type inductor array 60 in which the inductance of each of the inductors 65–68 is substantially equal and has very little deviation.

In the above-described preferred embodiments, in order to increase current capacity, one inductor is preferably defined by a plurality of internal conductors connected in parallel. However, one inductor may be defined by a single internal conductor or any number of internal conductors.

Further, the process of forming the integrated, laminated body is not limited to the steps described above. Insulating sheets which have been baked before stacking may be used. Further, lamination type inductor arrays may be produced by a method to be explained hereinafter. That is, after an insulating layer is formed by a method of printing insulating paste material, internal conductors are formed by applying conductive paste material on the surface of the insulating layer. Next, an insulating layer having the internal conductors inside is formed by coating insulating paste material over the internal conductor. In the same way, by coating one after another in order, a lamination type inductor array is obtained.

As made clear in the above explanation, according to preferred embodiments of the present invention, it is possible to obtain a lamination type inductor array in which the inductance of each of inductors inside a laminated body is substantially equal and the deviation of the inductance between the inductors is very small. This and various results and advantages described above are achieved because the conductor length of the inductors located adjacent to the end surfaces of the laminated is greater than the conductor length of the inductors located inside the above inductors, the internal conductors of the inductors located adjacent to the end surfaces of the laminated are arranged to extend in a zig zag line toward the side of the inductors located inside of the above inductors, the conductor width of the internal conductors of the inductors located inside of the following inductors is greater than the conductor width of the internal conductors located adjacent to the end surfaces of the laminated body, and other features. A lamination type inductor array of preferred embodiments of the present invention in which the distance between the end surfaces in the length direction of the laminated body and the inductors located adjacent to the end surfaces is about 0.5 mm or less provides advantages.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An inductor array comprising:
   a laminated body including insulating material layers and substantially linear internal conductors which are stacked on each other;
   a plurality of pairs of external input and output electrodes provided on a surface of the laminated body; and
   a plurality of inductors arranged such that both ends of each of the internal conductors are connected to the external input and output electrodes;
   wherein the shape of a first group of the internal conductors which are located adjacent to end surfaces of the laminated body is different from the shape of a second group of the internal conductors disposed inside of the first group of the inductors which are located adjacent to the end surfaces of the laminated body so that the inductance of each of the inductors is substantially equal.

2. An inductor array according to claim 1, wherein a length of the first group of the internal conductors located adjacent to the end surfaces of the laminated body is larger than a length of the second group of the internal conductors disposed inside of the first group of the inductors located adjacent to the end surfaces of the laminated body.

3. An inductor array according to claim 1, wherein the first group of the internal conductors located adjacent to the end surfaces of the laminated body are arranged to extend along a meandering line toward the side of the inductors disposed inside of the first group of the internal conductors located adjacent to the end surfaces of the laminated body.

4. An inductor array as claimed in claim 1, wherein a width of the second group of the internal conductors disposed inside of the first group of the internal conductors located adjacent to the end surfaces of the laminated body is wider than a width of the first group of the internal conductors located adjacent to the end surfaces of the laminated body.

5. An inductor array as claimed in claim 1, wherein the laminated body has a substantially rectangular parallelepiped shape.

6. An inductor array as claimed in claim 1, wherein the plurality of inductors are arranged to extend along the longitudinal direction of the laminated body.

7. An inductor array as claimed in claim 1, wherein the distance between the end surfaces in the longitudinal direction of the laminated body and the first group of the internal conductors located adjacent to the end surfaces is about 0.5 mm or less.

8. An inductor array comprising:

a laminated body including insulating material layers and substantially linear internal conductors which are stacked on each other;

a plurality of pairs of external input and output electrodes provided on a surface of the laminated body; and a plurality of inductors arranged such that both ends of each of the internal conductors are connected to the external input and output electrodes;

wherein at least one of the internal conductors has a shape that is different from a shape of the others of the internal conductors such that each of the inductors has a substantially equal inductance regardless of the location inside of the laminated body.

9. An inductor array according to claim 8, wherein at least two of the internal conductors have a shape that is different from the shape of the others of the internal conductors such that each of the inductors has a substantially equal inductance regardless of the location inside of the laminated body.

10. An inductor array according to claim 9, wherein the at least two internal conductors having the different shapes are located adjacent to end surfaces of the laminated body.

11. An inductor array according to claim 10, wherein the others of the internal conductors having the shape that is different from the at least two internal conductors are located between the at least two internal conductors inside of the laminated body.

12. An inductor array according to claim 11, wherein a length of the at least two internal conductors located adjacent to the end surfaces of the laminated body is larger than a length of the others of the internal conductors disposed between the at least two inductors located adjacent to the end surfaces of the laminated body.

13. An inductor array according to claim 11, wherein the at least two internal conductors located adjacent to the end surfaces of the laminated body are arranged to extend along a meandering line toward the side of the others of the inductors disposed between the at least two internal conductors located adjacent to the end surfaces of the laminated body.

14. An inductor array as claimed in claim 11, wherein a width of the others of the internal conductors disposed between the at least two internal conductors located adjacent to the end surfaces of the laminated body is wider than a width of the at least two internal conductors located adjacent to the end surfaces of the laminated body.

15. An inductor array as claimed in claim 8, wherein the laminated body has a substantially rectangular parallelepiped shape.

16. An inductor array as claimed in claim 8, wherein the plurality of inductors are arranged to extend along the longitudinal direction of the laminated body.

17. An inductor array as claimed in claim 8, wherein the distance between the end surfaces in the longitudinal direction of the laminated body and the at least two internal conductors located adjacent to the end surfaces is about 0.5 mm or less.

18. An electronic component comprising:

an electronic circuit; and an inductor disposed in the electronic circuit, the inductor including:

a laminated body including insulating material layers and substantially linear internal conductors which are stacked on each other;

a plurality of pairs of external input and output electrodes provided on a surface of the laminated body; and a plurality of inductors arranged such that both ends of each of the internal conductors are connected to the external input and output electrodes;

wherein the shape of a first group of the internal conductors which are located adjacent to end surfaces of the laminated body is different from the shape of a second group of the internal conductors disposed inside of the first group of the inductors which are located adjacent to the end surfaces of the laminated body so that the inductance of each of the inductors is substantially equal.

19. An electronic component according to claim 18, wherein a length of the first group of the internal conductors located adjacent to the end surfaces of the laminated body is larger than a length of the second group of the internal conductors disposed inside of the first group of the inductors located adjacent to the end surfaces of the laminated body.

20. An electronic component according to claim 18, wherein the first group of the internal conductors located adjacent to the end surfaces of the laminated body are arranged to extend along a meandering line toward the side of the inductors disposed inside of the first group of the internal conductors located adjacent to the end surfaces of the laminated body.

* * * * *